(12) United States Patent
Li et al.

(10) Patent No.: US 10,567,017 B2
(45) Date of Patent: Feb. 18, 2020

(54) SAW-LESS DESIGN IN LOW SUPPLY VOLTAGE AND SINGLE-ENDED RECEIVER AND ASSOCIATED SIGNAL PROCESSING METHOD

(71) Applicant: MEDIATEK INC., Hsin-Chu (TW)

(72) Inventors: Zong-You Li, Hsinchu (TW); Chi-Yao Yu, Hsinchu (TW); Chung-Yun Chou, Hsinchu (TW); Yen-Horng Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/413,622

(22) Filed: May 16, 2019

(65) Prior Publication Data

US 2019/0386692 A1 Dec. 19, 2019

Related U.S. Application Data

(60) Provisional application No. 62/686,740, filed on Jun. 19, 2018.

(51) Int. Cl.
*H04B 1/10* (2006.01)
*H04B 1/16* (2006.01)
(Continued)

(52) U.S. Cl.
CPC ........... *H04B 1/1018* (2013.01); *H03F 3/181* (2013.01); *H03H 7/42* (2013.01); *H03H 9/64* (2013.01);
(Continued)

(58) Field of Classification Search
CPC ...... H04B 1/10; H04B 1/1027; H04B 1/1036; H04B 2001/1063; H04B 1/109; H04B 1/12; H04B 1/16
See application file for complete search history.

(56) References Cited

U.S. PATENT DOCUMENTS 7,885,620 B2 * 2/2011 Molnar ............... H03D 7/1441
                                                        455/130
8,086,205 B2   12/2011 Thomas
(Continued)

FOREIGN PATENT DOCUMENTS

EP          2 624 463 A1      8/2013

OTHER PUBLICATIONS

Ahmad Mirzaei, "Reconfigurable RF Front-Ends for Cellular Receivers", IEEE, 2010.
(Continued)

*Primary Examiner* — Blane J Jackson
(74) *Attorney, Agent, or Firm* — Winston Hsu

(57) ABSTRACT

The present invention provides a receiver having an input node, a blocker detector, a translational filter and a low-noise amplifier. The input node is arranged to receive an input signal. The blocker detector is configured to detect if the input signal has a blocker to generate a detection result. The translational filter is configured to filter out an output-of-band blocker of the input signal to generate a filtered input signal at the input node or not filter output the output-of-band blocker of the input signal according to the detection result. The low-noise amplifier is configured to receive the filtered input signal or the input signal to generate an amplified input signal.

14 Claims, 4 Drawing Sheets

(51) Int. Cl.
  *H03H 7/42* (2006.01)
  *H03F 3/181* (2006.01)
  *H03H 9/64* (2006.01)
  *H04B 15/06* (2006.01)

(52) U.S. Cl.
  CPC ......... *H04B 1/1036* (2013.01); *H04B 1/1607* (2013.01); *H04B 15/06* (2013.01)

(56) References Cited

U.S. PATENT DOCUMENTS

| | | |
|---|---|---|
| 9,281,853 B2 | 3/2016 | Ong |
| 9,729,179 B1 | 8/2017 | Emadi |
| 9,793,935 B2 | 10/2017 | Lu et al. |
| 9,847,754 B2 | 12/2017 | Chu et al. |
| 9,859,930 B2 | 1/2018 | Lu |
| 2010/0267354 A1 | 10/2010 | Mirzaei |
| 2011/0230152 A1 | 9/2011 | Tsai |
| 2012/0171980 A1* | 7/2012 | Sivonen ............... H03H 19/008 455/293 |
| 2017/0012584 A1 | 1/2017 | Lee et al. |

OTHER PUBLICATIONS

Ahmad Mirzaei, "A 65 nm CMOS Quad-Band SAW-Less Receiver SoC for GSM/GPRS/EDGE", IEEE Journal of Solid-State Circuits, vol. 46, No. 4, Apr. 2011.

Ming-Da Tsai, "A Multi-Band Inductor-Less Saw-Less 2G/3G-TDSCDMA Cellular Receiver in 40nm CMOS", 2014 IEEE International Solid-State Circuits Conference, 2014.

* cited by examiner

SAW-LESS DESIGN IN LOW SUPPLY VOLTAGE AND SINGLE-ENDED RECEIVER AND ASSOCIATED SIGNAL PROCESSING METHOD

CROSS REFERENCE TO RELATED APPLICATIONS

This application claims the priority of U.S. Provisional Application No. 62/686,740, filed on Jun. 19, 2018, which is included herein by reference in its entirety.

BACKGROUND

In the advanced semiconductor process, the breakdown voltage of the transistor is decreased to 1V, and it is very harmful to receiver's linearity. In addition, because the out-of-band blockers may be higher than 0 dBm while the in-band signal may be −99 dBm in the 3GPP specification, the conventional art generally uses a surface acoustic wave (SAW) filter in a printed circuit board to reject the out-of-band blockers, or enlarges a supply voltage of the receiver and uses the differential structure to tolerate the out-of-band blockers, or uses an external balun to provide differential input signal and extra out-of-band blockers rejections. However, in order to save the manufacturing cost and improve GSM (Global System for Mobile Communications), GPRS (General Packet Radio Service), EDGE (Enhanced Data rates for GSM Evolution) sensitivity, the external SAW filter is suggested to be removed. In addition, as the growing demand of the cellular bands, the input ports of the receiver may be more than twenty, and the input port is necessary to be single-ended. Hence, these conventional arts are not suitable for the present demands of the receivers.

SUMMARY

It is therefore an objective of the present invention to provide a single-ended receiver, which has a better linearity without positioning a SAW filter or a balun in front of the receiver, and the receiver has a lower supply voltage to improve the power consumption, to solve the above-mentioned problems.

According to one embodiment of the present invention, a receiver having an input node, a blocker detector, a translational filter and a low-noise amplifier is disclosed. The input node is arranged to receive an input signal. The blocker detector is configured to detect if the input signal has a blocker to generate a detection result. The translational filter is configured to filter out an output-of-band blocker of the input signal to generate a filtered input signal at the input node or not filter output the output-of-band blocker of the input signal according to the detection result. The low-noise amplifier is configured to receive the filtered input signal or the input signal to generate an amplified input signal.

According to another embodiment of the present invention, a signal processing method comprises the steps of: receiving an input signal; detecting if the input signal has a blocker to generate a detection result; providing a translational filter to filter out an output-of-band blocker of the input signal to generate a filtered input signal at the input node or not filtering output the output-of-band blocker of the input signal according to the detection result; and receiving the filtered input signal or the input signal to generate an amplified input signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
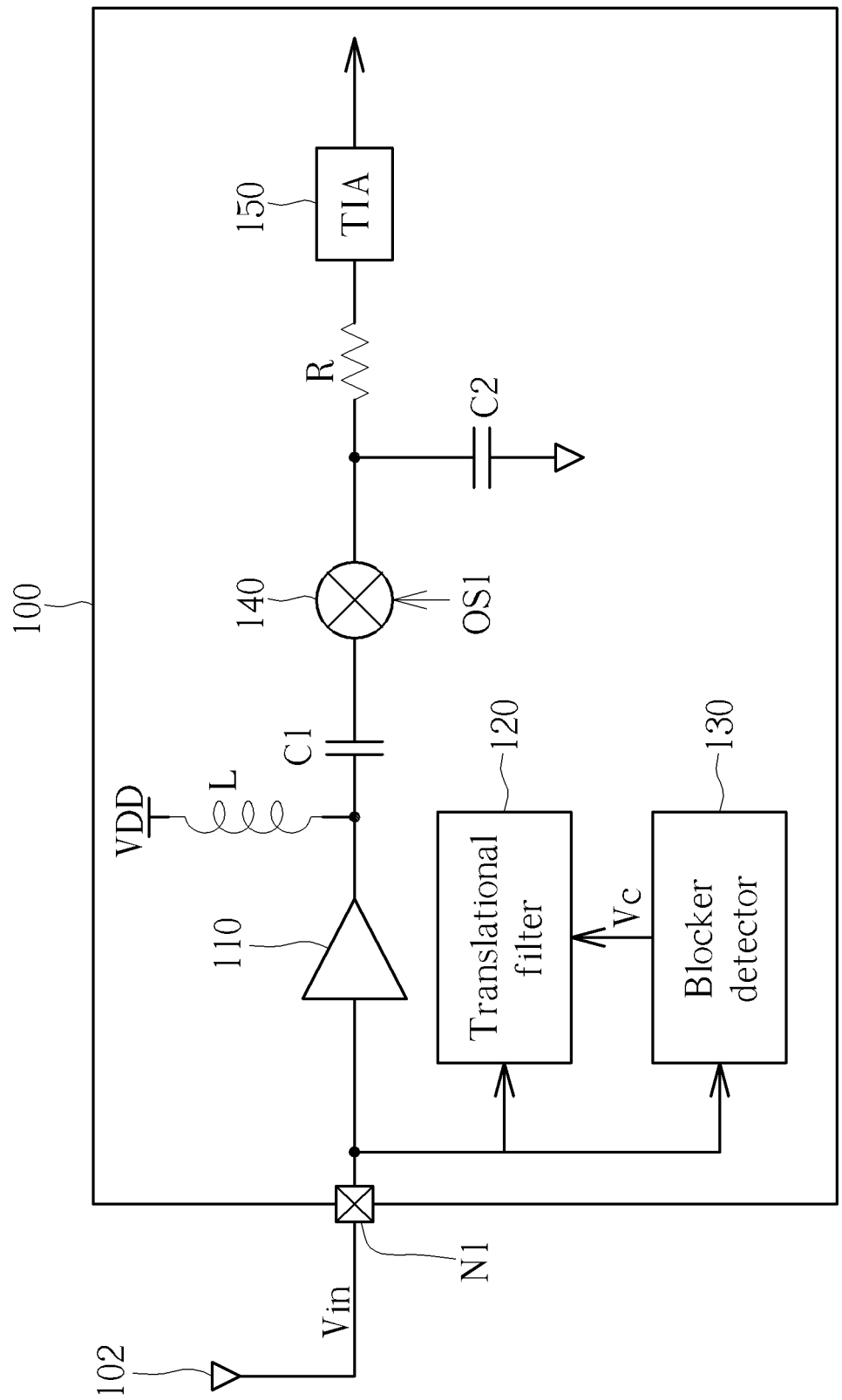
FIG. 1 is a diagram illustrating a receiver according to one embodiment of the present invention.

FIG. 1 is a diagram illustrating a receiver 100 according to one embodiment of the present invention. As shown in FIG. 1, the receiver 100 comprises an input node N1, a low-noise amplifier 110, a translational filter 120, a blocker detector 130, a mixer 140, a transimpedance amplifier (TIA) 150, an inductor L, capacitors C1 and C2, and a resistor R. In this embodiment, the receiver 100 supports the GSM/GPRS/EDGE standards, and the receiver 100 receives an input signal Vin from an antenna 102 without passing through any SAW filter or balun. In addition, the receiver 100 is a single-ended receiver, that is the low-noise amplifier 110 receives only one input signal Vin from the input node N1 (i.e. not a differential signal).

In the operations of the receiver 100, the input signal Vin from the antenna 102 is inputted to the receiver 100 via the input node N1, and the blocker detector 130 is always turned on to detect if the input signal Vin has a blocker to generate a detection result Vc to the translational filter 120. The translational filter 120 is turned on or off according to the detection result Vc, for example, if the detection result Vc indicates that the input signal Vin has the blocker, the translational filter 120 is enabled to filter output the out-of-band blocker of the input signal Vin to generate the filtered input signal at the input node N1; and if the detection result Vc indicates that the input signal Vin does not have the blocker, the translational filter 120 is disabled, and the input signal Vin at the input node N1 is not filtered. The low-noise amplifier 110 is configured to receive the filtered input signal if the translational filter 120 is enabled, or receive the input signal Vin if the translational filter 120 is disabled, to generate an amplified input signal. Then, the mixer 140 receives the amplified input signal via the inductor L and the capacitor C1, and mixers the amplified input signal with an oscillation signal OS1 to generate a mixed signal to the following components such as the capacitor C2, the resistor R and the TIA 150.

In the embodiment shown in FIG. 1, by using the translational filter 120 connected to the input node N1, the low-noise amplifier 110 can receive a clean input signal because the out-of-band blocker is removed from the input signal Vin, and the low-noise amplifier 110 can use a lower supply voltage VDD without losing the linearity. In addition, because the translational filter 120 is also a noise generator which may provide additional noises to the input signal Vin, the translational filter 120 is disabled to avoid generating the noises if no blocker is detected in the input signal Vin.

Figure 2:
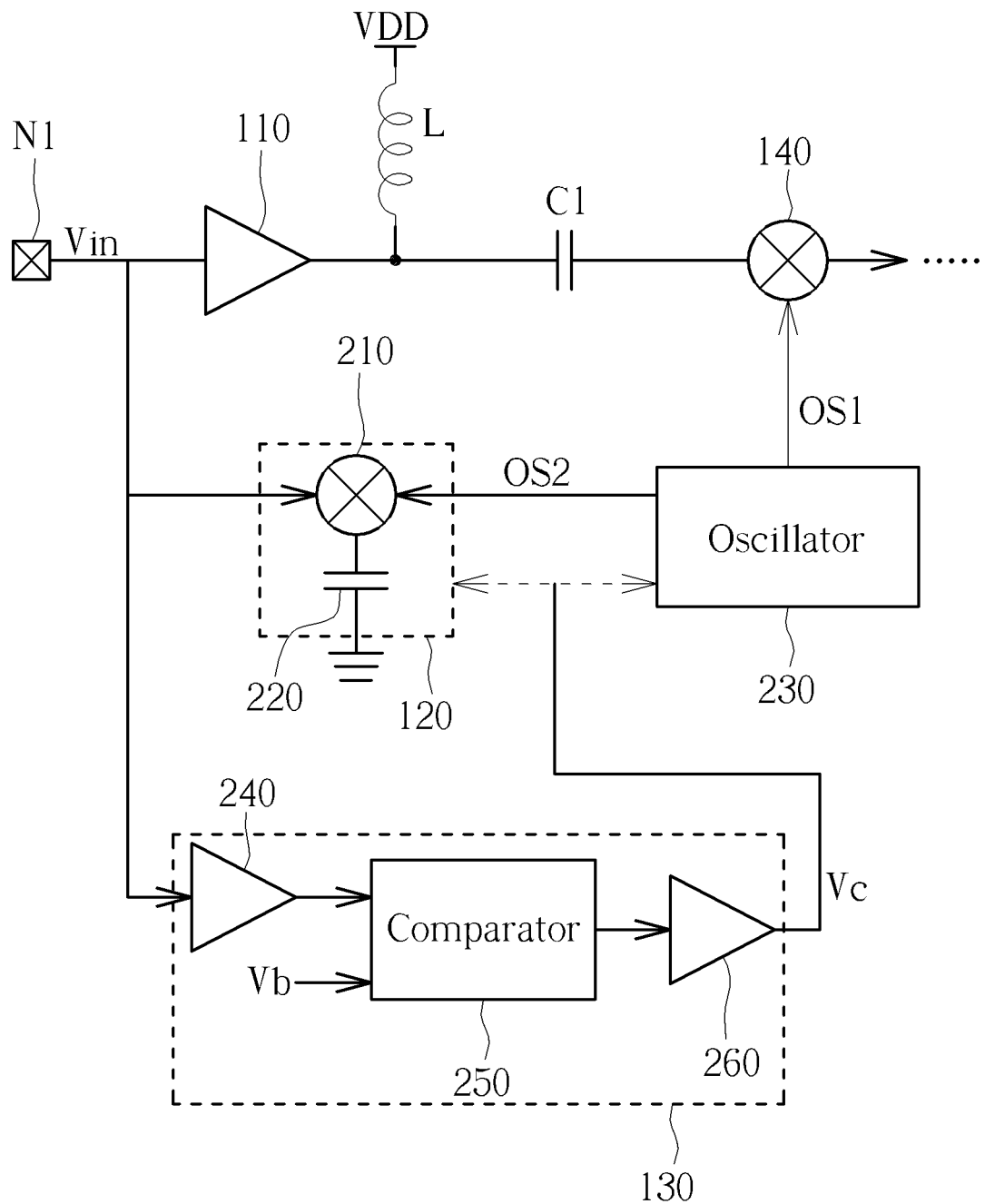
FIG. 2 shows a diagram illustrating the translational filter and the blocker detector according to one embodiment of the present invention.

FIG. 2 shows a diagram illustrating the translational filter 120 and the blocker detector 130 according to one embodiment of the present invention. As shown in FIG. 2, the translational filter 120 comprises a mixer 210 and a capacitor module 230, and the blocker detector 130 comprises a pre-amplifier 240, a comparator 250 and a latch 260. In the operations of the blocker detector 130, the pre-amplifier 240 amplifies the input signal Vin to generate a pre-amplified input signal, the comparator 250 compares the pre-amplified input signal with a reference voltage Vb to generate a comparison result, and the latch 260 generates the detection result Vc according to the comparison result. In the operations of the translational filter 120, the mixer 210 is configured to receive the input signal Vin and an oscillation signal OS2 to filter output the out-of-band blocker of the input signal Vin.

In one embodiment, the detection result Vc can be inputted into an oscillator 230 and/or the translational filter 120 to enable or disable the translational filter 120. For example, if it is detected that the input signal Vin does not have the blocker, the detection result Vc can control the oscillator 230 to not provide the oscillation signal OS2 to disable the translational filter 120, or the detection result Vc can disconnect the mixer 210 from the input node N1 by controlling a switch (not shown) in front of the mixer 210; and if it is detected that the input signal Vin has the blocker, the detection result Vc can control the oscillator 230 to provide the oscillation signal OS2 to enable the translational filter 120, or the detection result Vc can connect the mixer 210 to the input node N1.

Figure 3:
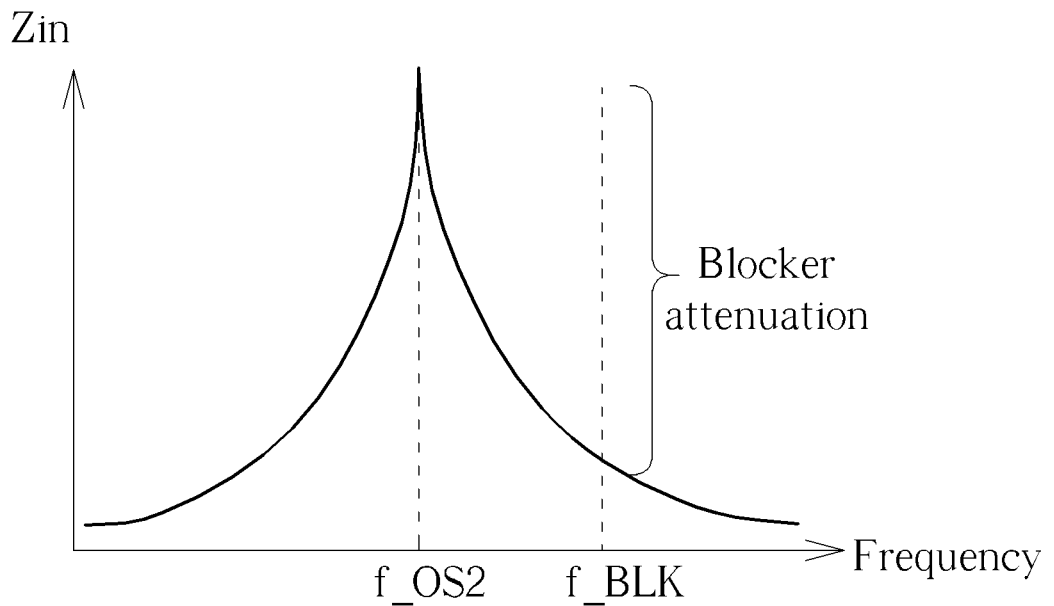
FIG. 3 shows the input impedance of the receiver when the translational filter is enabled.

Regarding the translational filter 120, the translational filter 120 can provide high input impedance at a center frequency of the oscillation signal OS2, and provide low input impedance outside the center frequency of the oscillation signal OS2, wherein the low input impedance means that the matching gain is approaching zero and the corresponding frequency components are attenuated. Therefore, after shunting the low-noise amplifier 110 and the translational filter 120, the input impedance will form a very sharp peak to effectively filter out the out-of-band blocker as shown in FIG. 3. In FIG. 3, the translational filter 120 operates as a notch filter, and the input impedance Zin of the receiver 100 is high at the center frequency (f_OS2) of the oscillation signal OS2, and the frequency of the out-of-band blocker (f_BLK) corresponds a low input impedance Zin, that is the out-of-band blocker is greatly attenuated.

In order to avoid influencing the in-band signal, the frequency of the oscillation signal OS2 is substantially equal to the frequency of the oscillation signal OS1 applied to the mixer 140.

Figure 4:
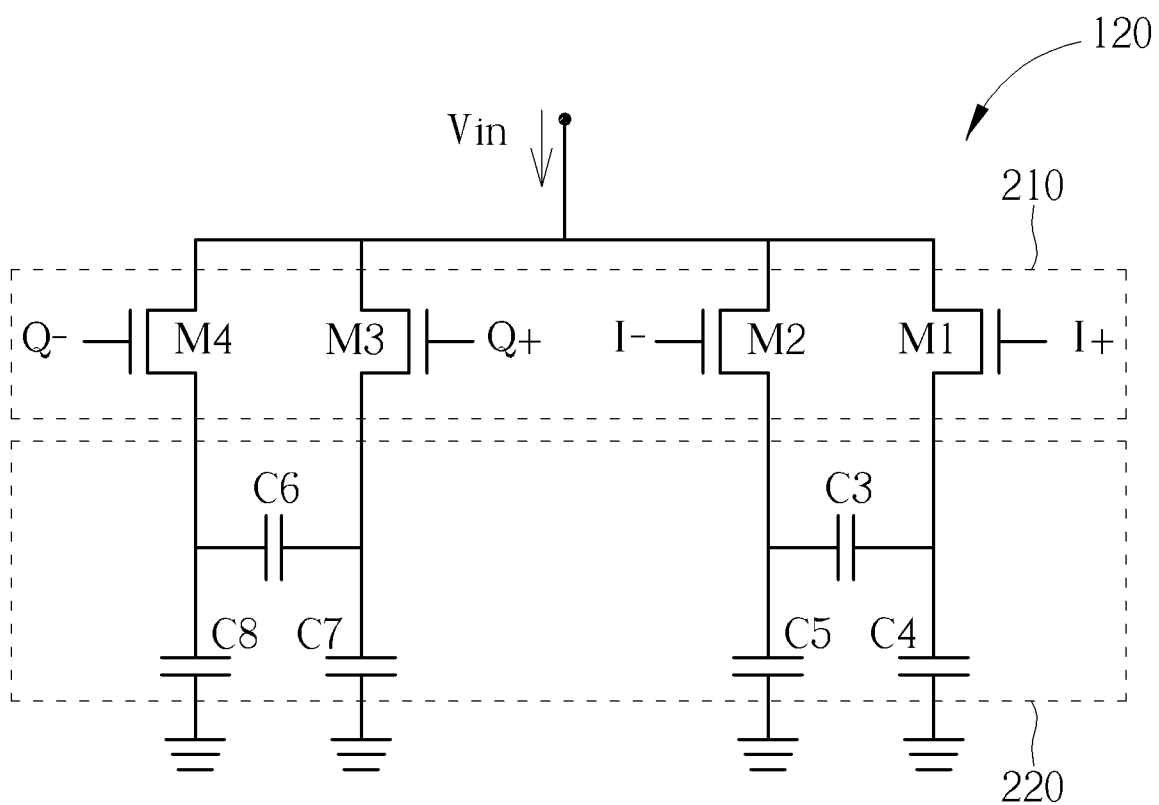
FIG. 4 shows the detailed structure of the mixer and the capacitor module within the translational filter according to one embodiment of the present invention.

FIG. 4 shows the detailed structure of the mixer 210 and the capacitor module 220 within the translational filter 120 according to one embodiment of the present invention. As shown in FIG. 4, the mixer 210 is a passive mixer comprising a first transistor M1, a second transistor M2, a third transistor M3 and a fourth transistor M4, and the capacitor module 220 comprises a plurality of capacitors C3-C8. In the mixer 210, agate electrode of the first transistor M1 receives a first in-phase oscillation signal I+, a first electrode of the first transistor M1 is coupled to the input node N1 to receive the input signal Vin, and a second electrode of the first transistor M1 is coupled to the capacitor module 220; a gate electrode of the second transistor M2 receives a second in-phase oscillation signal I−, a first electrode of the second transistor M2 is coupled to the input node N1 to receive the input signal Vin, and a second electrode of the second transistor M2 is coupled to the capacitor module 220; a gate electrode of the third transistor M3 receives a first quadrature oscillation signal Q+, a first electrode of the third transistor M3 is coupled to the input node N1 to receive the input signal Vin, and a second electrode of the third transistor M3 is coupled to the capacitor module 220; and a gate electrode of the fourth transistor M4 receives a second quadrature oscillation signal Q−, a first electrode of the fourth transistor M4 is coupled to the input node N1 to receive the input signal Vin, and a second electrode of the fourth transistor M4 is coupled to the capacitor module 220.

Figure 5:
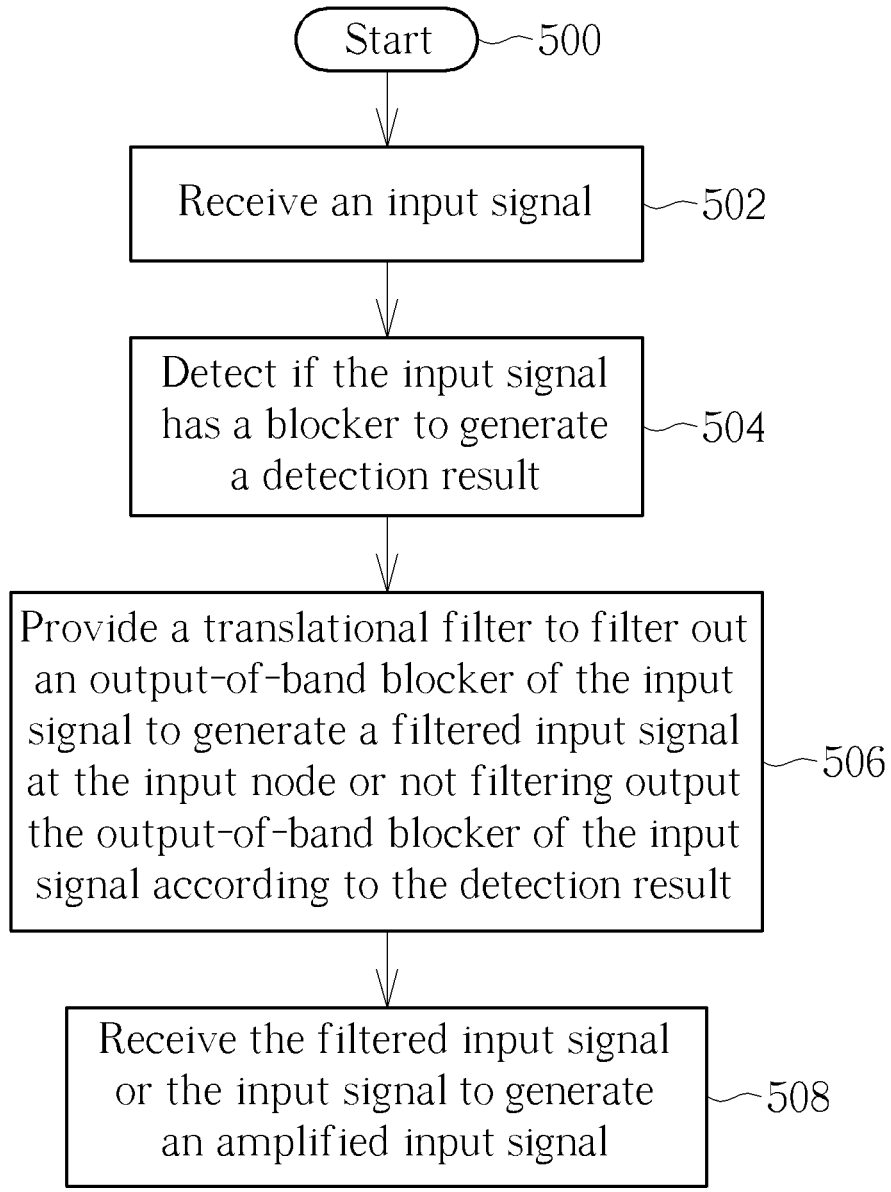
FIG. 5 is a flowchart of a signal processing method according to one embodiment of the present invention.

FIG. 5 is a flowchart of a signal processing method according to one embodiment of the present invention. Refer to FIGS. 1-5 and the above-mentioned disclosure, the flow is described as follows.

Step 500: the flow starts.
Step 502: receive an input signal.
Step 504: detect if the input signal has a blocker to generate a detection result.
Step 506: provide a translational filter to filter out an output-of-band blocker of the input signal to generate a filtered input signal at the input node or not filtering output the output-of-band blocker of the input signal according to the detection result.
Step 508: receive the filtered input signal or the input signal to generate an amplified input signal.

Briefly summarized, in the receiver of the present invention, by providing a translational filter at the input node of the low-noise amplifier, the out-of-band blocker can be removed from the input signal to make the low-noise amplifier has a better linearity under the lower supply voltage, and the SAW filter or the balun is not required in front of the receiver. In addition, the translational filter can be disabled if no blocker is detected, to avoid providing additional noise to the input signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A receiver, comprising:
an input node, for receiving an input signal;
a blocker detector, coupled to the input node, for detecting if the input signal has a blocker to generate a detection result;
a translational filter, coupled to the input node and the blocker detector, for filtering out an output-of-band blocker of the input signal to generate a filtered input signal at the input node or not filtering output the output-of-band blocker of the input signal according to the detection result; and a low-noise amplifier, coupled to the input node, for receiving the filtered input signal or the input signal to generate an amplified input signal.

2. The receiver of claim 1, wherein if the detection result indicates that the input signal does not have the blocker, the translational filter is disabled to not filter the input signal; and if the detection result indicates that the input signal has the blocker, the translational filter is enabled to filter out the output-of-band blocker of the input signal to generate the filtered input signal at the input node.

3. The receiver of claim 1, wherein both the translational filter and the low-noise amplifier are directly connected to the input node.

4. The receiver of claim 1, wherein the translational filter is a band-selective notch filter.

5. The receiver of claim 1, wherein the translational filter comprises a first mixer and capacitors.

6. The receiver of claim 5, wherein the first mixer is a passive mixer.

7. The receiver of claim 6, wherein the mixer comprises:
a first transistor, wherein a gate electrode of the first transistor receives a first in-phase oscillation signal, a first electrode of the first transistor is coupled to the input node;
a second transistor, wherein a gate electrode of the second transistor receives a second in-phase oscillation signal, a first electrode of the second transistor is coupled to the input node;
a third transistor, wherein a gate electrode of the third transistor receives a first quadrature oscillation signal, a first electrode of the third transistor is coupled to the input node; and
a fourth transistor, wherein a gate electrode of the fourth transistor receives a second quadrature oscillation signal, a first electrode of the fourth transistor is coupled to the input node;
wherein second electrodes of the first transistor, the second transistor, the third transistor and the fourth transistor are coupled to the capacitors.

8. The receiver of claim 5, wherein the first mixer receives a first oscillation signal, and the receiver further comprises:
a second mixer, coupled to the low-noise amplifier, for mixing the amplified input signal with a second oscillation signal to generate a mixed signal;
wherein the first oscillation signal and the second oscillation signal have a same frequency.

9. The receiver of claim 1, wherein the low-noise amplifier is a single-ended low-noise amplifier.

10. A signal processing method, comprising:
receiving an input signal;
detecting if the input signal has a blocker to generate a detection result;
providing a translational filter to filter out an output-of-band blocker of the input signal to generate a filtered input signal at the input node or not filtering output the output-of-band blocker of the input signal according to the detection result; and
receiving the filtered input signal or the input signal to generate an amplified input signal.

11. The signal processing method of claim 10, wherein the step of providing the translational filter to filter out the output-of-band blocker of the input signal to generate the filtered input signal at the input node or not filtering output the output-of-band blocker of the input signal according to the detection result comprises:
if the detection result indicates that the input signal does not have the blocker, disabling the translational filter to not filter the input signal; and
if the detection result indicates that the input signal has the blocker, enabling the translational filter to filter out the output-of-band blocker of the input signal to generate the filtered input signal at the input node.

12. The signal processing method of claim 10, wherein the translational filter is a band-selective notch filter.

13. The signal processing method of claim 10, wherein the translational filter comprises a first mixer and capacitors.

14. The signal processing method of claim 13, wherein the first mixer receives a first oscillation signal, and the signal processing method further comprises:
using a second mixer to mix the amplified input signal with a second oscillation signal to generate a mixed signal;
wherein the first oscillation signal and the second oscillation signal have a same frequency.

* * * * *